(12) United States Patent
Shim

(10) Patent No.: US 7,375,028 B2
(45) Date of Patent: May 20, 2008

(54) METHOD FOR MANUFACTURING A SEMICONDUCTOR DEVICE

(75) Inventor: Joon-Bum Shim, Seongnam (KR)

(73) Assignee: Dongbu Electronics Co., Ltd., Seoul (KR)

( * ) Notice: Subject to any disclaimer, the term of this patent is extended or adjusted under 35 U.S.C. 154(b) by 286 days.

(21) Appl. No.: 11/213,301

(22) Filed: Aug. 25, 2005

(65) Prior Publication Data

US 2006/0046469 A1   Mar. 2, 2006

(30) Foreign Application Priority Data

Aug. 27, 2004   (KR) ...................... 10-2004-0067996

(51) Int. Cl.
*H01L 21/4763* (2006.01)
(52) U.S. Cl. ...................... 438/637; 438/723; 438/712; 438/743; 438/756; 438/757; 257/E21.577; 257/E21.579
(58) Field of Classification Search ................ 438/637, 438/723, 712, 743, 756, 757; 257/E21.579, 257/E21.577
See application file for complete search history.

(56) References Cited

U.S. PATENT DOCUMENTS

| | | | |
|---|---|---|---|
| 4,789,648 A | 12/1988 | Chow et al. | |
| 5,563,105 A | 10/1996 | Dobuzinsky et al. | |
| 5,960,293 A * | 9/1999 | Hong et al. | 438/397 |
| 6,066,577 A | 5/2000 | Cooney, III et al. | |
| 6,147,009 A | 11/2000 | Grill et al. | |
| 6,310,300 B1 | 10/2001 | Cooney, III et al. | |
| 6,656,832 B1 * | 12/2003 | Pan et al. | 438/627 |
| 2002/0173158 A1 * | 11/2002 | Jeng | 438/706 |
| 2003/0003717 A1 * | 1/2003 | Park | 438/638 |
| 2004/0038518 A1 * | 2/2004 | Chung | 438/631 |

\* cited by examiner

*Primary Examiner*—Kiesha Rose
*Assistant Examiner*—Eric W Jones
(74) *Attorney, Agent, or Firm*—Andrew D. Fortney; Alec B. Plumb

(57) ABSTRACT

A semiconductor device may be manufactured by a method that includes forming an etch stop layer on a semiconductor substrate, sequentially forming a first interlayer insulating layer, a first diffusion barrier, a second interlayer insulating layer, and a second diffusion barrier on the etch stop layer, forming a via hole exposing the etch stop layer by etching the second diffusion barrier, the second interlayer insulating layer, the first diffusion barrier, and the first interlayer insulating layer, forming a first trench overlapping the via hole by etching the second diffusion barrier and the second interlayer insulating layer, forming a second trench continuous to the first trench by etching the first diffusion barrier and part of the first interlayer insulating layer, and removing the etch stop layer exposed through the via hole, wherein the first and second trenches are etched under different dry etching conditions.

19 Claims, 2 Drawing Sheets

METHOD FOR MANUFACTURING A SEMICONDUCTOR DEVICE

CROSS-REFERENCE TO RELATED APPLICATION

This application claims priority to and the benefit of Korean Patent Application No. 10-2004-0067996 filed in the Korean Intellectual Property Office on Aug. 27, 2004, the entire contents of which are incorporated herein by reference.

BACKGROUND OF THE INVENTION (a) Field of the Invention

The present invention relates to a semiconductor device. More particularly, the present invention relates to a method for manufacturing a semiconductor device having a damascene structure.

(b) Description of the Related Art

Recently, as semiconductor devices have become highly integrated and process technology has been enhanced, conventional aluminum wiring has been replaced by copper wiring for improving device characteristics such as operation speed and resistance of the device as well as parasitic capacitance between the metals. However, since copper has very poor etching characteristics, a damascene process is widely used for such a copper line instead of a conventional etching process.

In the damascene process, a dual damascene pattern including a via hole and a trench is formed in an interlayer insulating layer, and then copper is filled in the dual damascene pattern to form the copper metal line. The interlayer insulating layer is formed from undoped silicate glass (USG), a fluorine doped silicate glass (FSG), silicon nitride (SiN), etc. In some cases, a desired critical dimension (CD) may not be obtained when an upper profile of the trench is deformed. Such deformation may be due to an etch selectivity difference between the FSG and SiN layers.

In order to solve such a problem, a P—$SiH_4$ layer (e.g., a plasma-deposited silicon oxide layer and/or a silicon oxide layer formed by plasma-enhanced deposition from a silane precursor gas, also known as PEOX) may be used instead of the SiN layer. In this case, the deformation of the upper profile of the trench may be prevented since the etch selectivity difference between the FSG layer and the P—$SiH_4$ layer is not substantial. However, when an etching gas for FSG is used for etching the interlayer insulating layer having the P—$SiH_4$ layer therein, etching of the interlayer insulating layer becomes locally poor, and thus the via hole and the trench may not be uniform.

Thus, according to a conventional method, via holes and trenches may not be uniformly fabricated. In such cases, metal lines may show different resistances thereby producing an undesirable effect on operation of the semiconductor device (e.g., different metal lines may exhibit different signal transmission speeds; in extreme cases, the difference may be sufficiently great that the device cannot with manufactured within predefined specifications, or acceptable parameter variation or tolerance ranges).

The above information disclosed in this Background section is only for enhancement of understanding of the background of the invention and therefore it may contain information that does not form prior art that may be already known in this or any other country to a person of ordinary skill in the art.

SUMMARY OF THE INVENTION

The present invention has been made in an effort to provide a method for manufacturing a semiconductor device having advantages of achieving uniform dimensions (e.g., depth and size) of via holes and trenches.

According to an exemplary method for manufacturing a semiconductor device according to an embodiment of the present invention, an etch stop layer is formed on a semiconductor substrate. A first interlayer insulating layer, a first diffusion barrier, a second interlayer insulating layer, and a second diffusion barrier may be sequentially formed on the etch stop layer. A via hole exposing the etch stop layer is formed by etching the second diffusion barrier, the second interlayer insulating layer, the first diffusion barrier, and the first interlayer insulating layer. A first trench overlapping the via hole is formed by etching the second diffusion barrier and the second interlayer insulating layer. A second trench continuous to the first trench is formed (or, alternatively, the trench is extended to a second depth) by etching the first diffusion barrier and (part of) the first interlayer insulating layer. Then, the etch stop layer exposed through the via hole is removed. Here, the first and second trench-etching steps are performed under different (dry) etching conditions.

The exemplary method may further include forming a metal line filling the via hole and the trench after removing the etch stop layer.

Forming the first trench may comprise dry etching with an etching gas comprising $CHF_3$ at a flow rate of 20-80 sccm, $O_2$ at a flow rate of 10-20 sccm, and Ar a flow rate of at 400-600 sccm; and/or at a pressure of (e.g., in the etching chamber) maintained at a level of 50-100 mTorr; a source power maintained at 1,000-2,000 W; and a bias power maintained at 1,400-2,000 W.

In addition, forming the second trench may comprise dry etching with an etching gas comprising $C_5F_8$ at a flow rate of 10-30 sccm, $O_2$ at a flow rate of 10-20 sccm, and Ar at a flow rate of 600-800 sccm; and/or at a pressure of (e.g., in the etching chamber) maintained at a level of 50-150 mTorr; a source power maintained at 500-1,000 W; and a bias power maintained at 1,000-2,000 W.

The etch stop layer and the first and second diffusion barriers may each comprise an oxide layer (e.g., P—$SiH_4$). Furthermore, the first and second interlayer insulating layers may each comprise a fluorinated silica glass (FSG).

The etch stop layer may have a thickness of 200-400 Å, the first interlayer insulating layer may have a thickness of 4,000-6,000 Å, the first diffusion barrier may have a thickness of 500-1,000 Å, the second interlayer insulating layer may have a thickness of 3,000-5,000 Å, and the second diffusion barrier may have a thickness of 200-500 Å.

The semiconductor substrate may further comprise a lower metal line, and the metal line filling the via hole and the trench may be connected to the lower metal line therethrough (e.g., through the via hole).

DETAILED DESCRIPTION OF THE EMBODIMENTS

Figure 1:
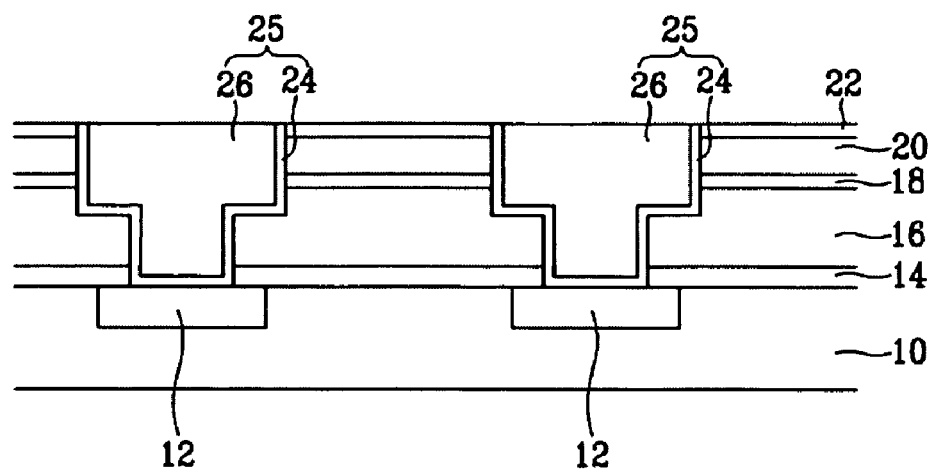
FIG. 1 is a cross-sectional view of a semiconductor device according to an exemplary embodiment of the present invention.

With reference to the accompanying drawings, the present invention will hereinafter be described in order for those skilled in the art to be able to implement the invention. As those skilled in the art would realize, the described embodiments may be modified in various different ways, all without departing from the spirit or scope of the present invention.

To clarify multiple layers and regions, the thicknesses of the layers are enlarged in the drawings. Like reference numerals designate like elements throughout the specification.

First, a semiconductor device according to an exemplary embodiment of the present invention will hereinafter be described in detail with reference to the accompanying drawings.

FIG. 1 is a cross-sectional view of a semiconductor device according to an exemplary embodiment of the present invention, showing a metal line of the semiconductor device.

As shown in FIG. 1, an etch stop layer 14, a first interlayer insulating layer 16, a first diffusion barrier 18, a second interlayer insulating layer 20, and a second diffusion barrier 22 are formed on a semiconductor substrate 10 that further contains a lower structure such as a metal line 12. The etch stop layer 14 and the first and second diffusion barriers 18 and 22 are formed from or comprise an oxide layer (e.g., using or comprising P—SiH$_4$). For example, the oxide layer may comprise or consist essentially of a plasma-deposited silicon oxide layer (e.g., SiO$_2$, or undoped silica glass [USG]) and/or a silicon oxide layer formed by PE-CVD, using silane gas (SiH$_4$) as a silicon source. The first and second interlayer insulating layers 16 and 20 respectively comprise FSG. Alternatively, first and second interlayer insulating layers 16 and 20 may comprise a low-k dielectric, such as a silicon oxycarbide (SiOC, or "black diamond") material. Also, etch stop layer 14 may comprise a material (e.g., silicon nitride) having a high etch selectivity relative to the first (or lower) insulating layer 16. Thus, etch stop layer 14 may comprise a different material from the first and second diffusion barriers 18 and 22.

A metal line 25 fills via hole V and a trench T, formed through the etch stop layer 14, the interlayer insulating layers 16 and 20, and the diffusion barriers 18 and 22, such that upper and lower wiring and/or circuits may be connected thereby. The metal line 25 includes a conductive diffusion barrier 24 formed on an interior surface of the via hole V and the trench T, and a bulk metal layer 26 filling the via hole V and the trench T and defined in part by the conductive diffusion barrier 24. Here, the conductive diffusion barrier 24 may comprise an alloy and/or conductive compound of titanium, tantalum and/or tungsten (e.g., a titanium nitride, titanium tungsten alloy, titanium tungsten nitride, tungsten nitride, tantalum nitride or tantalum silicon nitride [TaSiN] layer). In addition, the bulk metal layer 26 may comprise a conductive material such as copper (Cu), a metal showing low resistance.

Hereinafter, a method for forming the metal line of the semiconductor device shown in FIG. 1 according to an exemplary embodiment of the present invention will be described in detail with reference to FIG. 2 to FIG. 5. FIGS. 2-5 are sectional views showing sequential stages of a method for forming a metal line in a semiconductor device according to an exemplary embodiment of the present invention.

Figure 2:
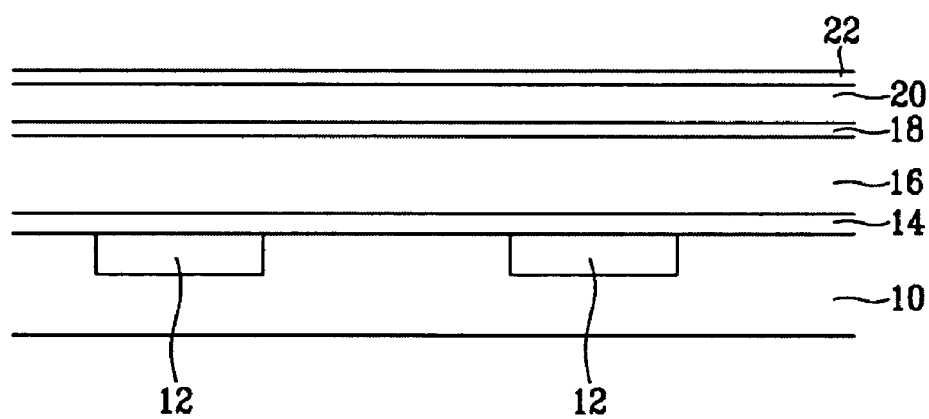
FIG. 2 to FIG. 5 are sectional views showing sequential stages of a method for manufacturing a semiconductor device according to an exemplary embodiment of the present invention.

Firstly, as shown in FIG. 2, the etch stop layer 14 is formed on the semiconductor substrate 10 containing a lower structure such as the metal lines 12 insulated from each other. The etch stop layer 14 is formed by depositing an oxide or nitride layer on the semiconductor substrate 10 to a thickness of 200-400 Å using, e.g., plasma-deposited SiH$_4$. Then the first or lower (interlayer) insulating layer 16 is formed on the etch stop layer 14 by depositing FSG, which is a low-k dielectric material (i.e., a dielectric material having a low dielectric constant), to a thickness of 4,000-6,000 Å.

Subsequently, the first diffusion barrier 18 is formed on the first interlayer insulating layer 16, by depositing an oxide layer (e.g., P—SiH$_4$) to a thickness of 500-1,000 Å, generally to reduce, inhibit, or prevent diffusion of fluorine (F) included in the first interlayer insulating layer 16 into adjacent layers. Then, the second or upper (interlayer) insulating layer 20 is formed on the first diffusion barrier 18 by depositing FSG to a thickness of 3,000-5,000 Å. Subsequently, the second diffusion barrier 22 is formed on the second interlayer insulating layer 20, by depositing an oxide layer (e.g., P—SiH$_4$) to a thickness of 200-500 Å, generally to reduce, inhibit, or prevent diffusion of fluorine (F) included in the second interlayer insulating layer 20 into adjacent layers.

Figure 3:
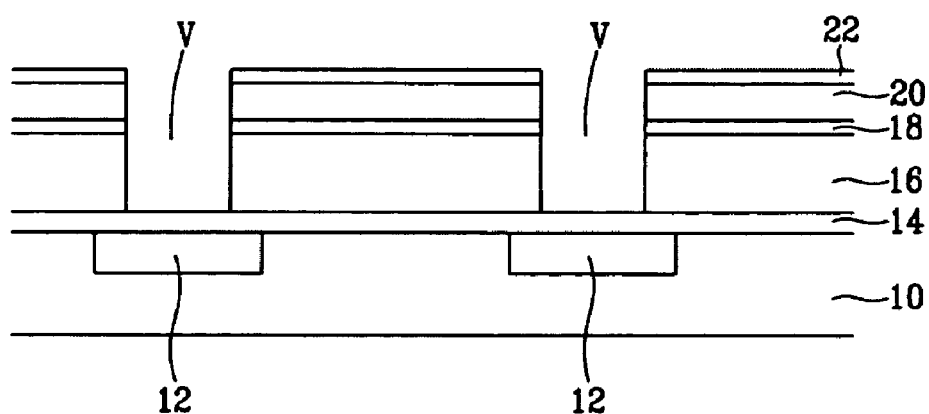

Then, referring to FIG. 3, a photosensitive layer pattern (not shown) is formed on the second diffusion barrier 22 and patterned by conventional photolithography to define the via hole V. Then, the via hole V is formed by (etching (e.g., non-selective dry etching) using the photosensitive layer pattern as a mask until the etch stop layer 14 is exposed.

Figure 4:
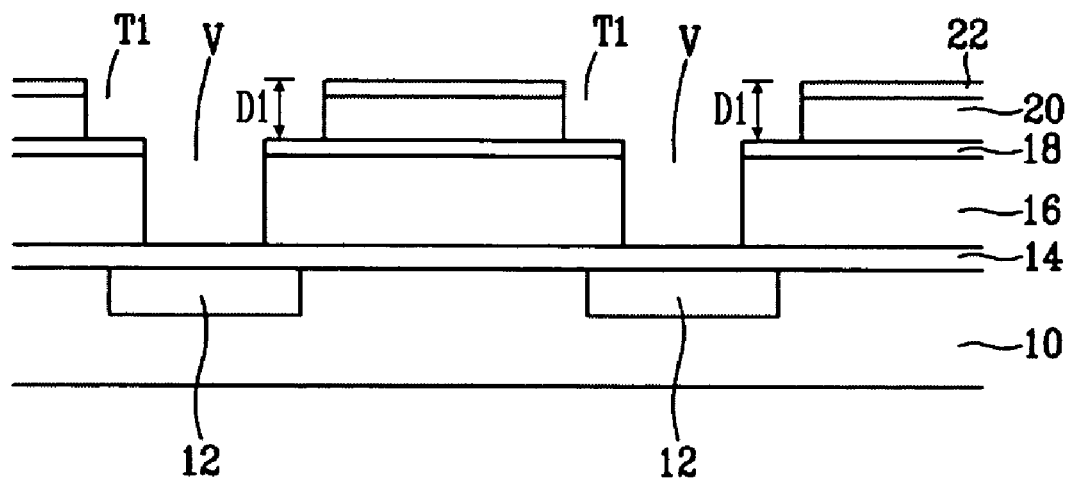

Now, referring to FIG. 4, the photosensitive layer pattern is removed with an oxygen plasma, and a new photosensitive layer pattern (not shown) is formed to define a trench (e.g., T1). Then, the first trench T1 exposing the via hole V is formed by dry etching the second diffusion barrier 22 and the second interlayer insulating layer 20 using the new photosensitive layer pattern as a mask. Trench T1 may have a depth D1, as shown, although the trench may be etched partly or completely through upper insulating layer 20, partly or completely through diffusion barrier layer 18, or partly through lower insulating layer 16.

Dry etching the first trench T1 may comprise supplying, providing or introducing into the etching chamber an etching gas comprising CHF$_3$ at a flow rate of 20-80 sccm, O$_2$ at a flow rate of 10-20 sccm, and Ar at a flow rate of 400-600 sccm. Also, conditions for the first trench etching step may comprise a pressure in the etching chamber maintained at a level of 50-100 mTorr, a source power (e.g., for generating plasma in the chamber) maintained at 1,000-2,000 W, and/or a bias power (e.g., for increasing linearity of the plasma) maintained at 1,400-2,000 W. Thus, the first trench forming step may comprise dry etching with an etching gas comprising a hydrofluorocarbon (e.g., a compound of the formula $C_xH_yF_z$, where $1 \leq x \leq 4$, $y \geq 1$ and $[y+z]=2x$ or $[2x+2]$, preferably where $1 \leq x \leq 2$, $y=1$ or 2, and $y+z=2x+2$) and a first oxygen source (e.g., O$_2$, O$_3$, NO and/or N$_2$O), generally at a pressure, a source power and a bias power sufficient to form trench T1 to a first depth D1.

Figure 5:
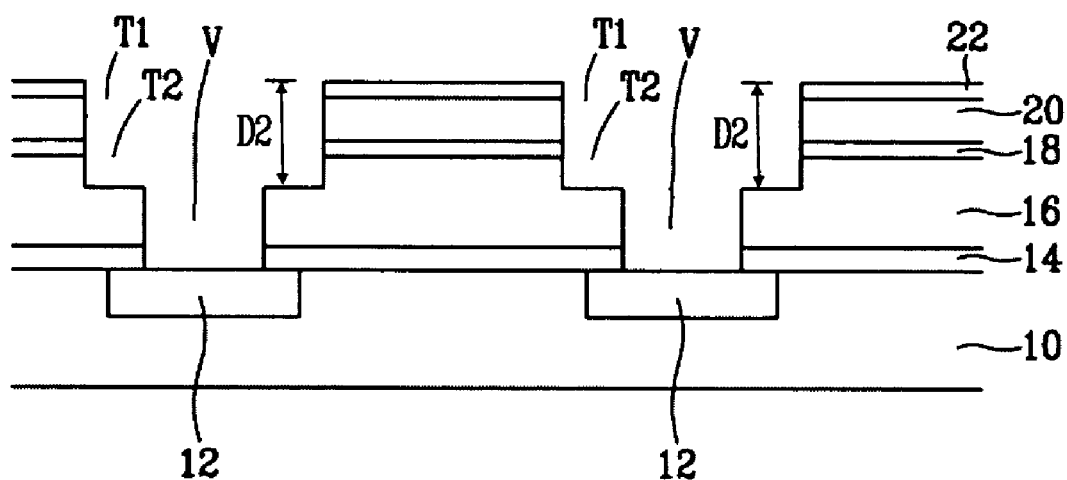

Then, as shown in FIG. 5, a second trench T2 is formed by dry etching the first diffusion barrier 18 and the first interlayer insulating layer 16. Alternatively, trench T1 is simply further etched, or extended, to a second depth D2 greater than first depth D1. In this second trench etching step, the trench may be etched partly through upper insulating layer 20, partly or completely through diffusion barrier layer 18, and/or partly through lower insulating layer 16.

Dry etching the second trench T2 may comprise supplying, providing or introducing into the etching chamber (in one embodiment, the same etching chamber as the first trench etching step) an etching gas comprising $C_5F_8$ at a flow rate of 10-30 sccm, $O_2$ at a flow rate of 10-20 sccm, and Ar at a flow rate of 600-800 sccm. Also, conditions for the first trench etching step may comprise a pressure maintained at a level of 50-150 mTorr, a source power maintained at 500-1,000 W, and/or a bias power maintained at 1,000-2,000 W. Thus, extending the trench (or increasing its depth) may comprise dry etching with an etching gas comprising a fluorocarbon (e.g., a compound of the formula $C_aF_b$, where $3 \leq a \leq 8$ and b=[2a−2], 2a or [2a+2], preferably where $4 \leq a \leq 6$ and b=[2a−2] or 2a) and a second oxygen source (which may be the same as or different from the first oxygen source; optionally in the presence of a carrier gas, such as a noble gas or nitrogen), generally at a pressure, a source power, and/or a bias power sufficient to provide a plurality of trenches across a semiconductor die or wafer having acceptable or predefined dimensions (e.g., within predefined tolerances and/or providing metal lines within predefined specifications). Notably, the trench-extending etch conditions differ from the initial trench-forming etch conditions in that the flow rate of the hydrofluorocarbon (in the trench-forming etch step) is generally higher than the flow rate of the fluorocarbon (in the trench-extending etch step), the flow rate of the carrier gas (e.g., Ar) is generally higher in the trench-extending etch step, and the source power and bias power are generally lower in the trench-extending etch step. Thus, precise etching of the (extended) trench may be obtained by realizing a small etch selectivity.

Subsequently, referring back to FIG. 1, the etch stop layer 14 exposed by the via hole V is removed such that the lower metal line 12 may be exposed. Then, a first metal layer (e.g., the conductive diffusion barrier 24) is thinly deposited on an interior surface of the via hole V and the trench(es) T1 and T2 by depositing a metal such as titanium, tantalum, tungsten or an alloy and/or conductive compound thereof. The first metal layer may further comprise an adhesive layer (e.g., titanium) between the conductive diffusion barrier and the interlayer dielectric (e.g., layers 14, 16, 18 20 and 22). Then, a second metal layer (e.g., the bulk metal layer 26) is formed, filling the via hole V, the trench T1/T2 (see FIG. 5), and (at least in part) first metal layer 24. Copper, which is a metal showing low resistance, is preferably used as the second metal layer 26.

Subsequently, chemical mechanical polishing is performed to expose an upper surface of the second diffusion barrier 22, such that the metal line 25 fills the via hole V and trench T substantially exactly.

According to the above described etching gases and process conditions according to exemplary embodiments of the present invention, trenches and via holes may become uniform in their dimensions (e.g., depths and sizes). Therefore, resistances of metal lines formed in the trenches and via holes may also become relatively uniform (e.g., within a predefined range of values), and a semiconductor device of better quality may be obtained.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a semiconductor device, comprising:
    forming an etch stop layer on the semiconductor substrate;
    sequentially forming a first interlayer insulating layer, a first diffusion barrier, a second interlayer insulating layer, and a second diffusion barrier on the etch stop layer;
    forming a via hole exposing the etch stop layer by etching the second diffusion barrier, the second interlayer insulating layer, the first diffusion barrier, and the first interlayer insulating layer;
    forming a first trench overlapping the via hole by etching the second diffusion barrier and the second interlayer insulating layer;
    forming a second trench continuous to the first trench by etching the first diffusion barrier and part of the first interlayer insulating layer; and
    removing the etch stop layer exposed through the via hole,
    wherein the first and second trenches are etched under different etching conditions.

2. The method of claim 1, further comprising, after removing the etch stop layer, forming a metal line filling the via hole and the trench.

3. The method of claim 2, wherein:
    the semiconductor substrate further comprises a lower metal line; and
    the metal line filling the via hole and the trench connects to the lower metal line through the via hole.

4. The method of claim 1, wherein forming the first wench comprises dry etching with an etching gas comprising $CHF_3$ at a flow rate of 20-80 sccm, $O_2$ at a flow rate of 10-20 sccm, and Ar at a flow rate of 400-600 sccm.

5. The method of claim 4, wherein forming the first trench further comprises dry etching at a pressure of 50-100 mTorr, a source power of 1,000-2,000 W, and a bias power of 1,400-2,000 W.

6. The method of claim 4, wherein forming the second trench comprises dry etching with an etching gas comprising $C_5F_8$ at a flow rate of 10-30 sccm, $O_2$ at a flow rate of 10-20 sccm, and Ar at a flow rate of 600-800 sccm, at a pressure of 50-150 mTorr, a source power of 500-1,000 W, and a bias power of 1,000-2,000 W.

7. The method of claim 1, wherein forming the second trench comprises day etching with an etching gas comprising $C_5F_8$ at a flow rate of 10-30 sccm, $O_2$ at a flow rate of 10-20 sccm, and Ar at a flow rate of 600-800 sccm.

8. The method of claim 7, wherein forming the second trench further comprises day etching at a pressure of 50-150 mTorr, a source power of 500-1,000 W, and a bias power of 1,000-2,000 W.

9. The method of claim 1, wherein:
    the etch stop layer comprises a P—$SiH_4$ oxide layer.

10. The method of claim 1, wherein:
    the first and second diffusion barriers each comprise a P—$SiH_4$ oxide layer; and
    the first and second interlayer insulating layers each comprise a fluorinated silica glass (FSG).

11. The method of claim 1, wherein the etch stop layer has a thickness of 200-400 Å, the first interlayer insulating layer has a thickness of 4,000-6,000 Å, the first diffusion barrier has a thickness of 500-1,000 Å, the second interlayer insulating layer bas a thickness of 3,000-5,000 Å, and the second diffusion barrier has a thickness of 200-500 Å.

12. A method for manufacturing a semiconductor device, comprising:

forming an etch stop layer on a semiconductor substrate;

sequentially forming a first interlayer insulating layer, a first diffusion barrier, a second interlayer insulating layer, and a second diffusion barrier on the etch stop layer;

forming a via hole exposing the etch stop layer by etching the second diffusion barrier, the second interlayer insulating layer, the first diffusion barrier, and the first interlayer insulating layer at an etching chamber pressure of 50-100 mTorr, a source power of 1,000-2,000 W, and a bias power of 1,400-2,000 W;

forming a trench overlapping the via hole by etching the second diffusion barrier and the second interlayer insulating layer with an etching gas including $CHF_3$ at a flow rate of 20-80 sccm, $O_2$ at a flow rate of 10-20 sccm, and Ar at a flow rate of 400-600 sccm; and removing the etch stop layer exposed through the via hole.

13. The method of claim 12, wherein the first and second diffusion barriers comprise a P—$SiH_4$ oxide layer.

14. The method of claim 12, wherein the etch stop layer comprises a P—$SiH_4$ oxide layer.

15. A method for manufacturing a semiconductor device, comprising:

forming a via hole through first and second diffusion barriers and upper and lower insulating layers, the via hole exposing an underlying etch stop layer;

etching the second diffusion baffler and the upper insulating layer under first etching conditions to form a trench having a first depth, the wench overlapping the via hole;

etching the first diffusion barrier and the lower insulating layer under second etching conditions to extend the trench to a second depth, the second etching conditions differing from the first etching conditions; and removing the etch stop layer exposed through the via hole.

16. The method of claim 15, wherein the etch stop layer and the first and second diffusion barriers each comprise a P—$SiH_4$ oxide layer, and the lower and upper insulating layers each comprise a fluorinated silica glass (FSG).

17. The method of claim 16, wherein the etch stop layer has a thickness of 200-400 Å, the lower insulating layer has a thickness of 4,000-6,000 Å, the first diffusion barrier has a thickness of 500-1,000 Å, the upper insulating layer has a thickness of 3,000-5,000 Å, and the second diffusion barrier has a thickness of 200-500 Å.

18. The method of claim 15, wherein:

forming the trench comprises dry etching with an etching gas comprising a hydrofluorocarbon and a first oxygen source at a pressure, a source power, and a bias power sufficient to form the Wench at the first depth; and extending the wench to the second depth comprises dry etching with an etching gas comprising a fluorocarbon and a second oxygen source at a pressure, a source power, and a bias power sufficient to provide a plurality of wenches across the semiconductor device with predefined dimensions.

19. The method of claim 18, wherein:

forming the trench comprises dry etching with an etching gas comprising $CHF_3$, at a flow rate of 20-80 sccm, $O_2$ at a flow rate of 10-20 sccm, and Ar at a flow rate of 400-600 sccm; and extending the trench to the second depth comprises dry etching with an etching gas comprising $C_5F_8$ at a flow rate of 10-30 sccm, $O_2$ at a flow rate of 10-20 sccm, and Ar at a flow rate of 600-800 sccm.

* * * * *